(12) United States Patent
Puzella et al.

(10) Patent No.: US 9,974,159 B2
(45) Date of Patent: May 15, 2018

(54) EGGCRATE RADIO FREQUENCY INTERPOSER

(71) Applicant: Raytheon Company, Waltham, MA (US)

(72) Inventors: Angelo M. Puzella, Marlborough, MA (US); John B. Francis, Littleton, MA (US); Dennis W. Mercier, Hudson, MA (US); John Sangiolo, Auburndale, MA (US); Mark Ackerman, Sudbury, MA (US); Ethan S. Heinrich, Westborough, MA (US)

(73) Assignee: Raytheon Company, Waltham, MA (US)

( * ) Notice: Subject to any disclaimer, the term of this patent is extended or adjusted under 35 U.S.C. 154(b) by 0 days. days.

(21) Appl. No.: 14/944,733

(22) Filed: Nov. 18, 2015

(65) Prior Publication Data
US 2017/0142824 A1      May 18, 2017

(51) Int. Cl.
*H05K 1/02*     (2006.01)
*H05K 1/09*     (2006.01)
(Continued)

(52) U.S. Cl.
CPC ......... *H05K 1/0237* (2013.01); *H01R 12/523* (2013.01); *H01R 24/50* (2013.01); *H01R 24/54* (2013.01); *H05K 1/09* (2013.01); *H05K 1/115* (2013.01); *H01R 12/714* (2013.01); *H05K 1/0216* (2013.01); *H05K 1/0222* (2013.01); *H05K 1/144* (2013.01); *H05K 1/18* (2013.01); *H05K 1/183* (2013.01); *H05K 2201/10378* (2013.01)

(58) Field of Classification Search
CPC ......... H05K 1/0237; H05K 1/09; H05K 1/115
See application file for complete search history.

(56) References Cited

U.S. PATENT DOCUMENTS 5,228,861 A * 7/1993 Grabbe ................. H01R 12/52
                                                            439/591
5,800,184 A * 9/1998 Lopergolo ........... H05K 7/1069
                                                            439/591
(Continued)

FOREIGN PATENT DOCUMENTS

WO      WO 2009/143252 A1      11/2009

OTHER PUBLICATIONS

PCT International Search Report dated Jan. 2, 2017 corresponding to International Application No. PCT/US2016/061023; 12 Pages.

*Primary Examiner* — Ishwarbhai B Patel
(74) *Attorney, Agent, or Firm* — Daly, Crowley, Mofford & Durkee, LLP

(57) ABSTRACT

An radio-frequency (RF) interposer enables low-cost, high-performance RF interconnection of two or more large-area printed wiring boards (PWBs). The RF interposer may be provided as a multi-port coaxial structure embedded in a metal (or metalized) carrier. The RF interposer may include one or more conductive shims having spring fingers to provide contact across air-gaps between a PWB RF ground plane and a ground plane of the RF interposer. Retractable pins may be used as the coaxial transmission line center conductors. The RF interposer may be provided as an N×M grid of unit cells each having one or more RF ports and a cavities to provide clearance for a PWB component.

16 Claims, 11 Drawing Sheets

(51) Int. Cl.
  *H05K 1/11*    (2006.01)
  *H01R 12/52*   (2011.01)
  *H01R 24/50*   (2011.01)
  *H01R 24/54*   (2011.01)
  *H05K 1/18*    (2006.01)
  *H01R 12/71*   (2011.01)
  *H05K 1/14*    (2006.01)

(56) References Cited

U.S. PATENT DOCUMENTS

| | | | |
|---|---|---|---|
| 6,332,782 B1 * | 12/2001 | Bezama | H05K 1/141 |
| | | | 439/66 |
| 6,611,180 B1 | 8/2003 | Puzella et al. | |
| 6,624,787 B2 | 9/2003 | Puzella et al. | |
| 6,731,189 B2 | 5/2004 | Puzella et al. | |
| 7,348,932 B1 * | 3/2008 | Puzella | H01Q 21/0025 |
| | | | 342/373 |
| 7,671,696 B1 | 3/2010 | Puzella et al. | |
| 7,758,351 B2 * | 7/2010 | Brown | H01R 43/16 |
| | | | 439/66 |
| 7,859,835 B2 | 12/2010 | Puzella et al. | |
| 8,279,131 B2 | 10/2012 | Puzella et al. | |
| 8,451,165 B2 | 5/2013 | Puzella et al. | |
| 8,581,801 B2 | 11/2013 | Puzella et al. | |
| 8,758,067 B2 * | 6/2014 | Rathburn | H01R 12/52 |
| | | | 439/66 |
| 8,981,869 B2 | 3/2015 | Puzella et al. | |
| 9,019,166 B2 | 4/2015 | Puzella et al. | |
| 9,033,740 B2 | 5/2015 | Shahoian | |
| 9,124,361 B2 | 9/2015 | Puzella et al. | |
| 2006/0113107 A1 | 6/2006 | Williams | |
| 2012/0104543 A1 | 5/2012 | Shahoian | |
| 2012/0206892 A1 | 8/2012 | Shahoian et al. | |
| 2013/0148322 A1 | 6/2013 | Fosnes et al. | |
| 2014/0111373 A1 | 4/2014 | Puzella et al. | |
| 2014/0218253 A1 | 8/2014 | Puzella et al. | |
| 2014/0242816 A1 | 8/2014 | Rathburn | |
| 2015/0015453 A1 | 1/2015 | Puzella et al. | |

* cited by examiner

EGGCRATE RADIO FREQUENCY INTERPOSER

BACKGROUND

As is known in the art, a phased array antenna includes a plurality of antenna elements spaced apart from each other by known distances coupled through a plurality of phase shifter circuits to either or both of a transmitter or receiver. In some cases, the phase shifter circuits are considered to be part of the transmitter and/or receiver. Phased array antenna systems are adapted to produce a beam of radio frequency (RF) energy and direct such beam along a selected direction by controlling the phase of the RF energy passing between the transmitter or receiver and the array of antenna elements. In an electronically scanned phased array, the phase of the phase shifter circuits, and thus the beam direction, may be selected by sending a control signal to each of the phase shifter sections. The control signal is typically a digital signal representative of a desired phase shift, as well as a desired attenuation level and other control data.

Phased array antennas are often used in both defense and commercial electronic systems. For example, Active Electronically Scanned Arrays (AESAs) are in demand for a wide range of defense and commercial electronic systems such as radar surveillance, terrestrial and satellite communications, mobile telephony, navigation, identification, and electronic counter measures. AESAs offer numerous performance benefits over passive scanned arrays as well as mechanically steered apertures. However, the costs that can be associated with deploying AESAs can limit their use. An order of magnitude reduction in array cost could enable widespread AESA insertion into military and commercial systems for radar, communication, and electronic warfare (EW) applications.

There is a desire to lower acquisition and life cycle costs of phased arrays while meeting bandwidth, polarization diversity, and reliability requirements. One way to reduce costs when fabricating RF systems is to utilize printed wiring boards (PWBs)—sometimes referred to as printed circuit boards (PCBs)—which allow use of so-called "mixed-signal circuits." Mixed-signal circuits typically refer to any circuit having two or more different types of circuits on the same circuit board, for example both analog and digital circuits integrated on a single circuit board.

One type of architecture used for phased array antennas is the so-called "panel" or "tile" architecture. With a panel architecture, the RF circuitry and signals are distributed in a plane that is parallel to a plane defined by the antenna aperture. The tile architecture uses basic building blocks in the form of tiles, wherein each tile can be formed of a multi-layer structure including antenna elements and its associated RF circuitry. To reduce manufacturing and assembly costs, it may be desirable to use PWBs having a single layer of components (or relatively fewer layers) and to interconnect two or more such PWBs to form a panel. Interconnecting (or "mating") two or more large-area PWBs can be challenging.

One existing approach is to solder connect two or more PWBs and add "bullet" type connects between them. However, this approach may be expensive in terms of cost and time. This is particularly true when a large number of connectors is required. Moreover, the existing approach does not permit "blind mating" of the PWBs. Another existing approach is to use so-called "fuzz buttons," however fuzz buttons can be difficult to work with resulting in difficult assembly and low yield. Yet another known approach is to use conductive elastomeric pads, but elastomeric pads are generally not suitable high power applications.

SUMMARY

It is appreciated herein that there is a need for improved (e.g., lower-cost and/or higher performance) structures and techniques to provide reliable RF interconnection between two or more printed wiring board (PWB) assemblies, in particular large-area PWB assemblies having a large number of RF ports.

In accordance with one aspect of the disclosure, a radio frequency (RF) interposer comprises: a carrier structure having a first planar surface and a second planar surface opposite the first planar surface; a plurality of RF ports supported by the carrier structure, each of the RF ports comprising a coaxial transmission line structure having a center conductor extending from carrier structure first planar surface to the carrier structure second planar surface and an outer conductor electrically separated from the center conductor by a dielectric insulator; a first conductive shim having a plurality of spring fingers; and a second conductive shim having a plurality of spring fingers, wherein, when the first conductive shim is disposed over the carrier structure first planar surface and the second conductive shim is disposed over the carrier structure second planar surface, an electrical pathway is established between the first shim, outer conductors of ones of the plurality of RF ports, and the second shim.

With this particular arrangement, an RF interposer structure having a plurality of coaxial transmission line connections embedded in metal (or metallized) carrier structures enables "blind-mate" RF interconnection across multiple RF ports between two large-area PWB assemblies and supports high peak and/or average RF power applications over a wide operating range, while eliminating the need for a single, large-area multilayer PWB assembly. The RF interposer reduces costs by replacing RF connectors and bullets with a ground plane having spring fingers to make electrical contact across air-gaps between a PWB RF ground plane and a ground plane of the RF interposer. The spring finger ground plane also serves to provide low loss, well isolated RF transmission line connections between RF ports, while bridging air gaps to provide contact between a PWB ground plane and the RF interposer. It will be appreciated that the RF interposer is well-suited for use in panel-based actively electronically scanned antenna (AESA) applications.

In some embodiments, the first and second conductive shims include a plurality of openings sized and positioned to expose center conductors of the RF ports when the first conductive shim is disposed over the carrier structure first planar surface and the second conductive shim is disposed over the carrier structure second planar surface. The spring fingers of the first conductive shim may be arranged around one or more of the openings.

In certain embodiments, the carrier structure includes a plurality of cavities positioned and sized to provide clearance for components of a printed wiring board (PWB) mated to the RF interposer. In some embodiments, ones of the plurality of RF port center conductors are provided as retractable pins. In various embodiments, the carrier structure is provided as a conductive material (e.g., aluminum) or a non-conductive material having a conductive coating. In a particular embodiment, the first and second conductive shims compromise copper sheets.

In some embodiments, the RF interposer includes a plurality of periodically arranged unit cells, wherein each of the unit cells includes a fixed number of the RF ports. The unit cells may be arranged in a grid, in a triangular lattice, or in any other suitable configuration. In certain embodiments, each of the unit cells includes two of the RF ports. The carrier structure may include a plurality of cavities positioned and sized to provide clearance for components of a printed wiring board (PWB) mated to the RF interposer, wherein each of the unit cells includes one of the plurality of cavities.

In various embodiments, the RF interposer also includes a plurality of alignment pins extending perpendicular to the first planar surface.

BRIEF DESCRIPTION OF THE DRAWINGS

The concepts, structures, and techniques sought to be protected herein may be more fully understood from the following detailed description of the drawings, in which.

The drawings are not necessarily to scale, or inclusive of all elements of a system, emphasis instead generally being placed upon illustrating the concepts, structures, and techniques sought to be protected herein.

DETAILED DESCRIPTION

Figure 1:
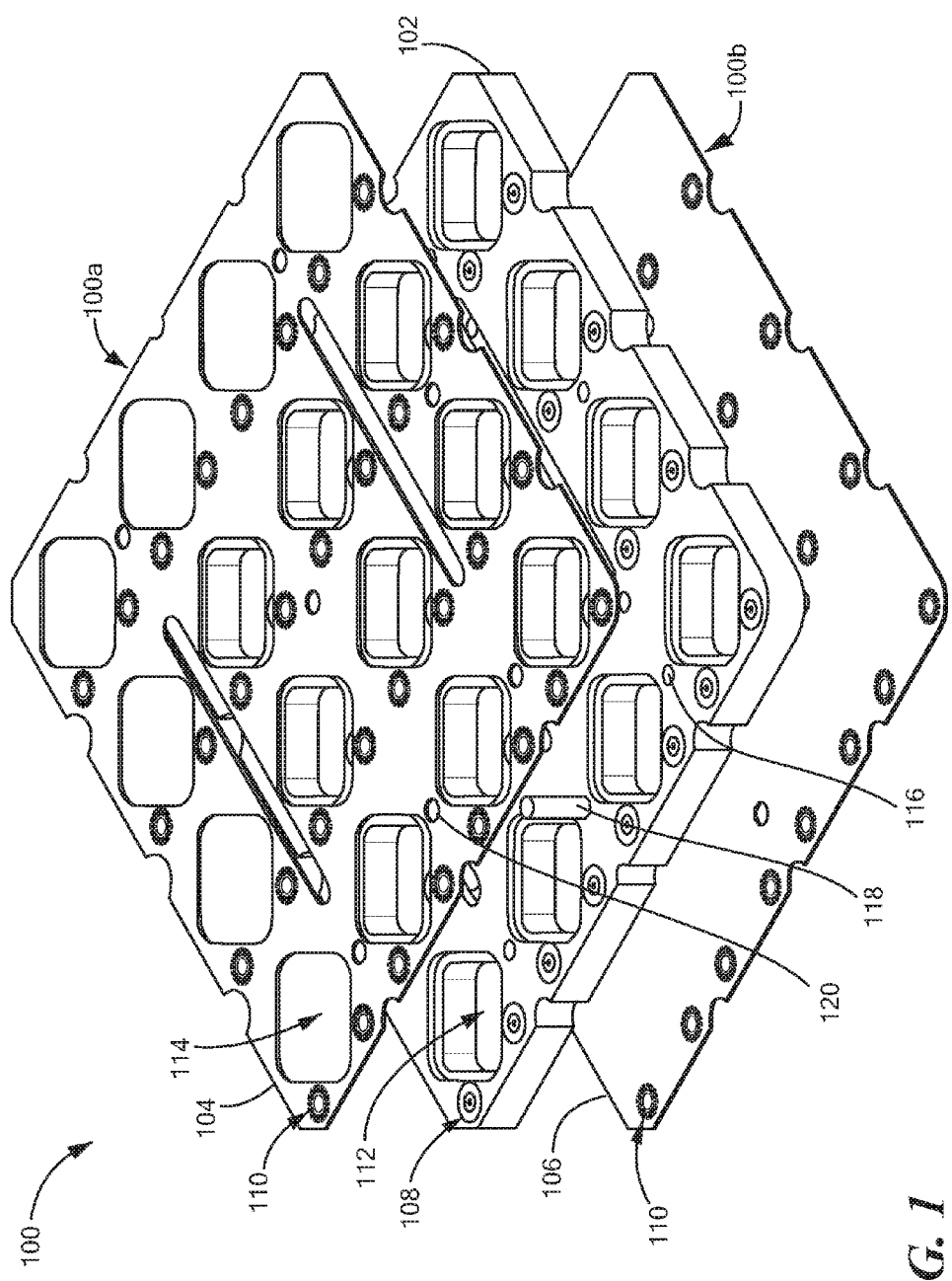
FIG. 1 is an exploded view of an illustrative RF interposer.

Referring to FIG. 1, an illustrative RF interposer 100 includes a carrier structure 102, a first conductive shim 104, a second conductive shim 106, and a plurality of RF ports 108 supported by the carrier structure 102. To promote clarity in the several figures, individual ones (but not necessarily all) of similar parts may be shown with reference designators. For example, only one of the plurality of RF ports 108 is labeled in FIG. 1.

The RF interposer 100 can provide RF interconnection between two or more printed wiring board (PWB) assemblies (not shown in FIG. 1). In particular, when a first PWB assembly is coupled (or "mated") to a first side 100a of the RF interposer and when a second PWB assembly is coupled to a second side 100b of the RF interposer, the RF interposer 100 can provide RF connectivity (i.e., electrical pathways suitable for carrying RF signals) between RF ports located upon the first PWB assembly and a corresponding RF ports located upon the second PWB assembly.

A given PWB assembly may include an arbitrary number of components (e.g., passive RF transmission lines, antenna elements, and/or active RF electronics) and corresponding RF ports arranged in any desirable manner. Thus, the number of interposer RF ports 108 and the position of those ports within the carrier structure 102 can be selected based upon the number and position of corresponding RF ports upon the PWB assemblies. For example, if a PWB assembly has periodically spaced RF ports, the interposer 100 may have like periodically spaced RF ports 108.

In the specific embodiment shown, an illustrative RF interposer 100 includes thirty-two (32) RF ports 108 arranged periodically in rows and columns. This arrangement may be suitable for providing RF interconnection between PWB assemblies each having sixteen (16) components and two (2) RF ports per component. However, the RF ports 108 could also be arranged in a non-periodic manner.

In addition to supporting the interposer RF ports 108, the carrier structure 102 also acts as a RF return path from the PWB assemblies. For example, when a PWB assembly is mated to RF interposer 100, electrical contact may be made between a ground plane on the PWB assembly and a conductive surface of the carrier structure 102. Thus, the carrier structure 102 may be provided from any suitable material that provides the necessary RF ground plane conductivity.

In some embodiments, the carrier structure 102 may be provided from a conductive (i.e., low impedance) material, such as machined aluminum or other metal. For example, the carrier structure 102 may be comprised of machined aluminum within a finishing coat, such as Trivalent Chromate Conversion coating (MIL-DTL-5541, Type II, Class 3). Alternatively, the carrier structure 102 may be provided from nonconductive (or low conductive) material coated with a conductive finish (i.e., metallized). For example, the carrier structure 102 may comprise a machined FR-4 material, another epoxy-based material, a molded plastic, etc., coated with conductive material such as copper plating.

Electrical contact between the PWB RF ground planes and the carrier structure 102 can be facilitated using conductive shims 104, 106 (i.e., a conductive shim may be part of a RF return path from a PWB ground plane to a carrier structure 102). A conductive shim 104, 106 may be provided as sheet of conductive material, non-limiting examples of which include copper, a copper plated material, an electroless nickel-plated material, and a tin-lead plated material. In particular embodiments, a conductive shim 104, 106 is provided as a sheet of beryllium-copper having a thickness between 0.002 and 0.005 inches.

Figure 6:
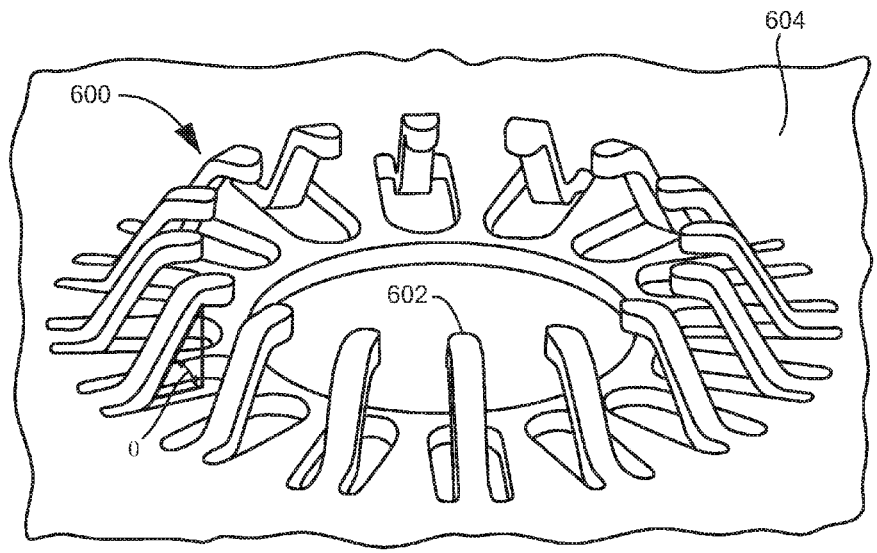
FIG. 6 is an isometric view of an illustrative spring finger arrangement that may form a part of an RF interposer.
Figure 7:
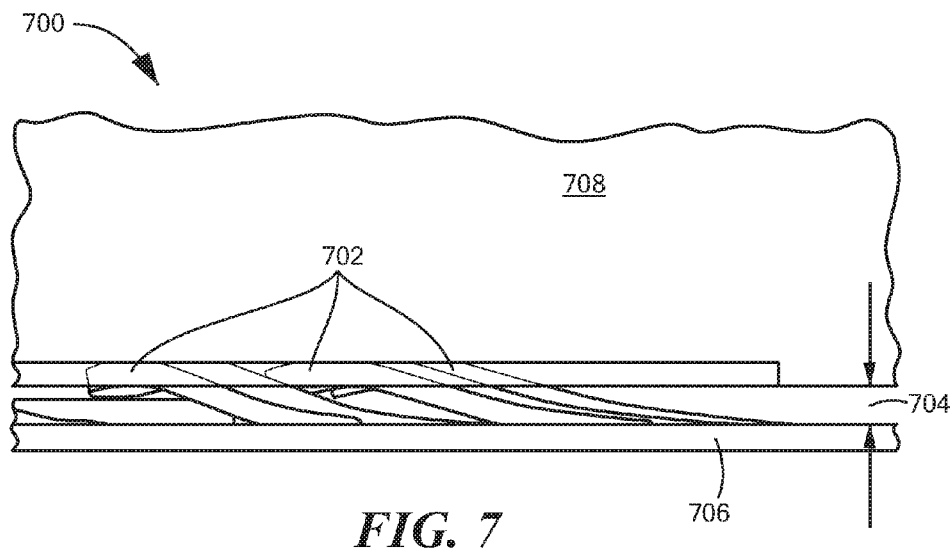
FIGS. 7 and 7A are side views of an illustrative spring finger arrangement for use that may form a part of an RF interposer.

In various embodiments, a conductive shim 104, 106 includes a plurality of spring finger arrangements 110 to make electrical contact across air-gaps between a PWB assembly mated to the RF interposer 100, thereby facilitating low-loss, well-isolated RF interconnection of large-area PWB assemblies have imperfect planar surfaces. The spring finger arrangements 110 may provide the primary RF coaxial ground connection between PWB RF ground and RF interposer RF ground. In one example, a conductive shim 104, 106 with spring fingers can bridge an air gap of up to 5 mils between PWB assembly and the RF interposer 100. The spring finger arrangements 110 may be formed out of the conductive shim material itself (e.g., as part of a continuous RF ground layer sheet). Thus, the conductive shims 104, 106 may comprise a material having good "rebound" properties, such as beryllium copper. Illustrative spring finger arrangements are shown in FIGS. 6 and 7 and descried below in conjunction therewith.

The conductive shims 104, 106 may be bonded to the carrier structure 102 using any suitable means. For example, the shims 104, 106 can be fixedly attached to the carrier structure 102 using solder or conductive epoxy. As another example, the conductive shims 104, 106 can be simply pressed between the PWB assemblies and the carrier structure 102 (e.g., when the PWB assemblies are screwed to the carrier structure 102).

Figure 3:
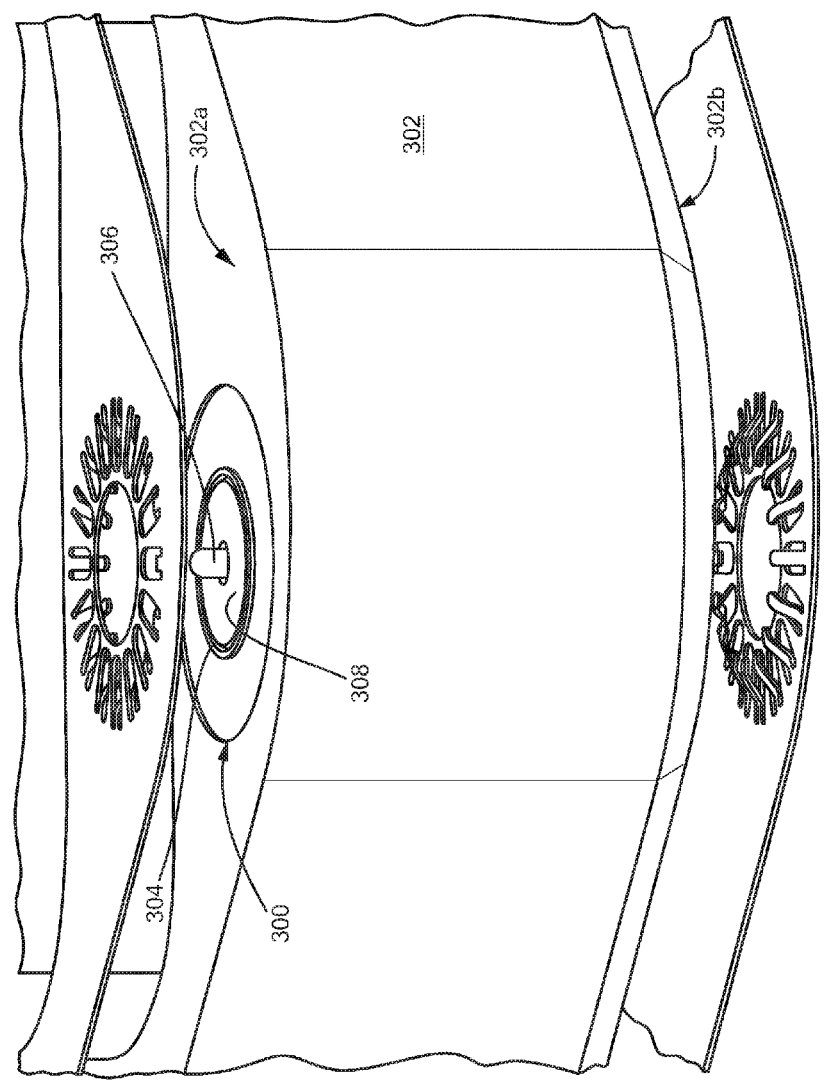
FIG. 3 is an isometric view of an illustrative RF port that may form a part of an RF interposer.
Figure 4:
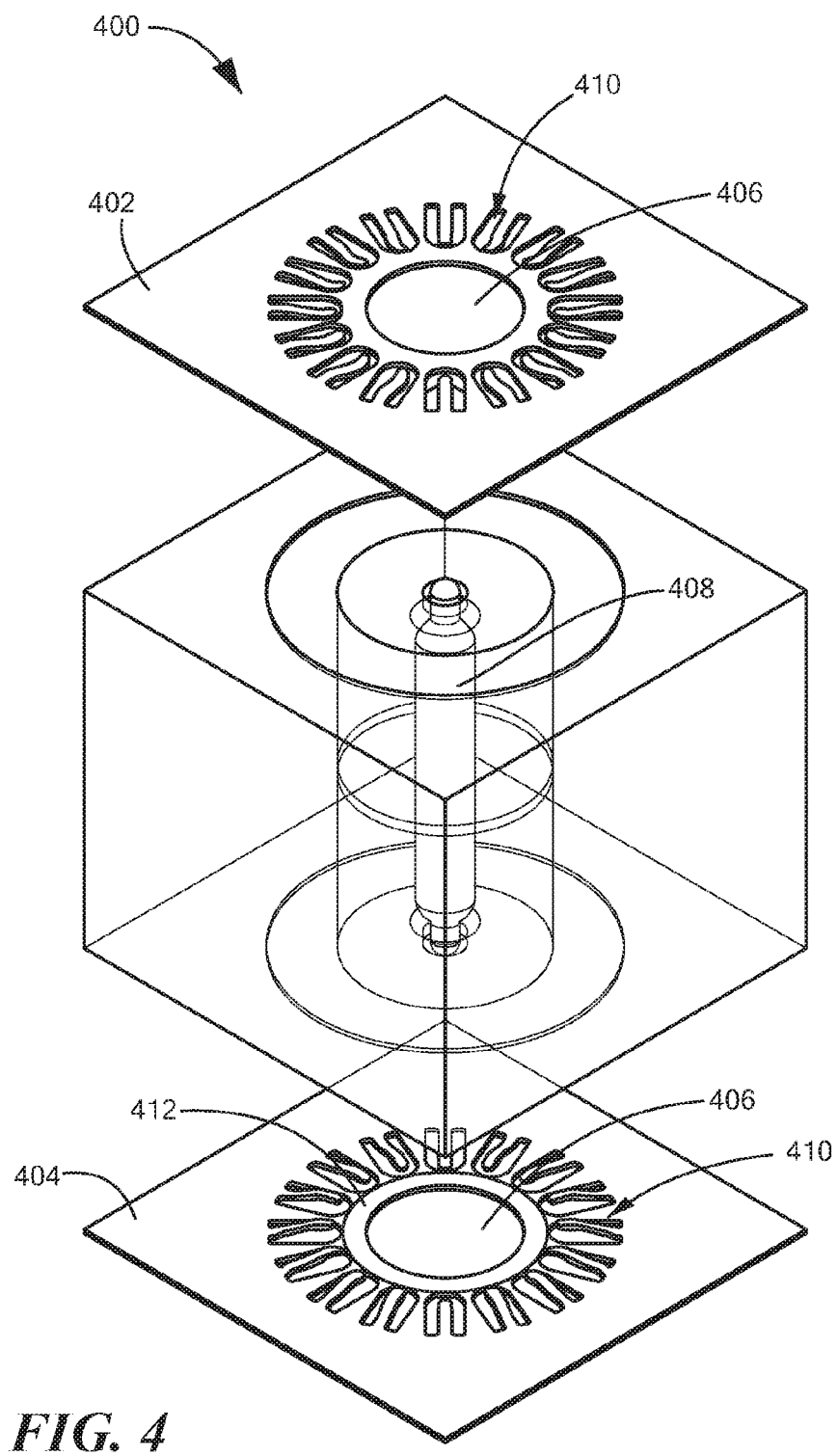
FIG. 4 is a transparent exploded view of an illustrative RF port for use within an RF interposer.
Figure 5:
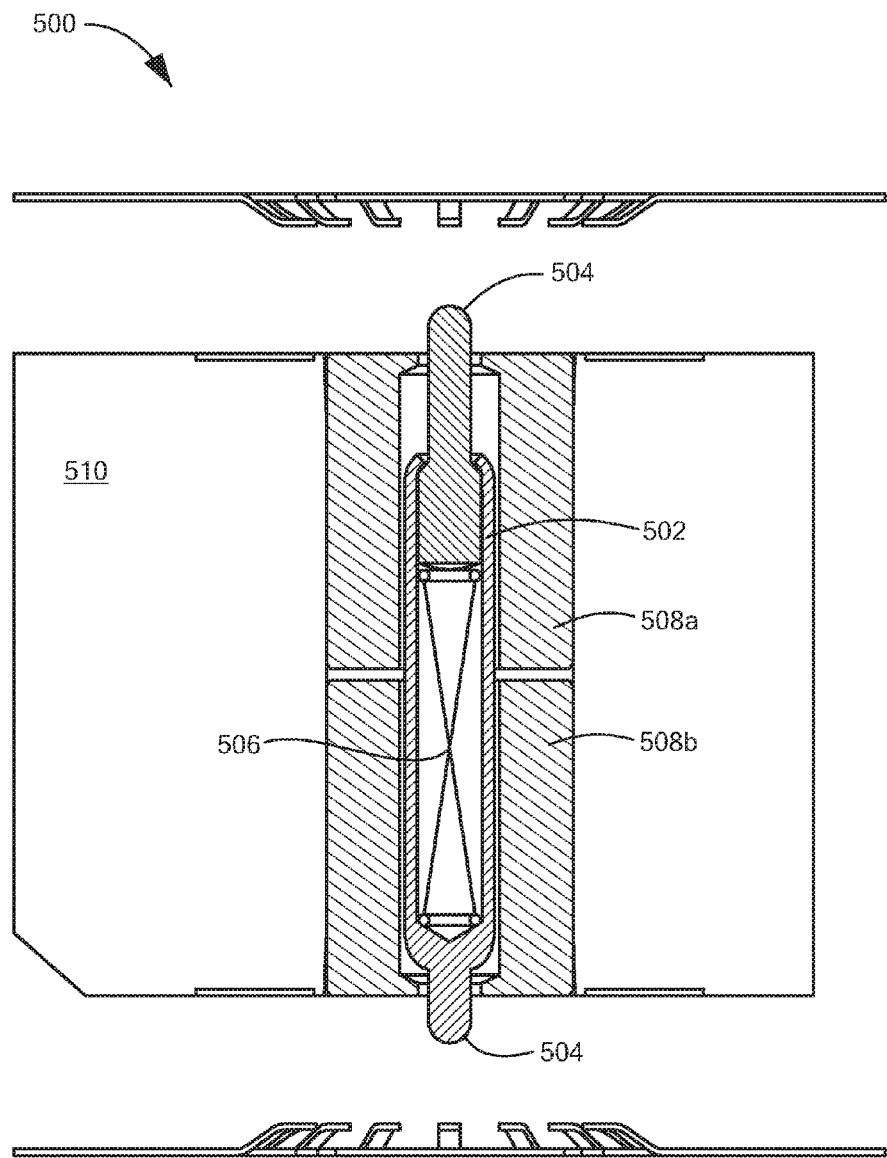
FIGS. 5 and 5A are cross-sectional views of an illustrative RF port for use within an RF interposer.

In various embodiments, the RF ports 108 are provided as coaxial transmission lines embedded in (e.g., pressed into) the carrier structure 102. Thus, a given RF port 108 may include a center conductor oriented transverse to the major plane of the carrier structure 108, a dielectric insulator surrounding the center conductor, and an outer conductor (or "shield") surrounding the dielectric insulator. In embodiments where the carrier structure 104 is provided as a conductive material (or a non-conductive material coated with a conductive finish), the carrier structure itself can serve as the outer conductors for the multiple coaxial RF ports 108. It will be appreciated that this arrangement may reduce the total number of RF connectors required to interconnect two PWB assemblies, thereby reducing costs and improving reliability. Moreover, in this arrangement, the conductive shims 104, 106 further serve to provide low loss, well-isolated RF transmission line connections between RF ports. Illustrative coaxial RF ports 108 are shown in FIGS. 3-5 and described below in conjunction therewith.

In some embodiments (and as shown in FIG. 1), the carrier structure 102 may include one or more cavities (or openings) 112 to provide clearance for components of a PWB assembly mated to the RF interposer 100. In some embodiments, some or all openings 112 may extend entirely through the carrier structure 102 whereas in other embodiments, openings 112 may not extend entirely through the carrier structure 102.

The cavities 112 allow a double-sided PWB assembly (i.e., an PWB assembly having components situated on a first surface and on a second opposite surface) to be mated to the interposer 100. The number of cavities 112, as well as the location and dimensions of each cavity, may be selected to match the layout of a given PWB assembly. In the example, shown, the cavities 112 are substantially square and may be machined out of the carrier structure 102. The conductive shims 104, 106 may include corresponding openings 114 to provide access to the component cavities 112. In the embodiment shown, the first conductive shim 104 includes cavity openings 114, whereas the second conductive shim 106 does not. This configuration may be suitable for mating a double-sided PWB assembly to the first side 100a of the interposer and a single-sided PWB assembly to the second side 100b of the interposer.

In other embodiments, the carrier structure 102 does not include component cavities 112 and thus may be provided as a solid (or substantially solid) structure. In this arrangement, the RF interposer 100 may be used to interconnect two single-sided PWB assemblies.

It will be appreciated that good RF performance requires proper alignment of the interposer RF ports 108 and PWB RF ports. For example, it may be a requirement that the RF ports be aligned within a tolerance of less than five mils in the lateral plane. To reduce misalignment, the carrier structure 102 may include one or more alignment holes 116 into which alignment pins 118 can be fitted (e.g., press fitted). The number, position, and size of the alignment holes 116 may be selected based upon corresponding alignment holes located within a PWB assembly. Likewise, the length of the alignment pins 118 may be selected based on the dimensions of the RF interposer 100 and/or the dimensions of the PWB assembly. The 104, 106 may include corresponding openings 120 through which the alignment pins 118 may pass.

Figure 1A:
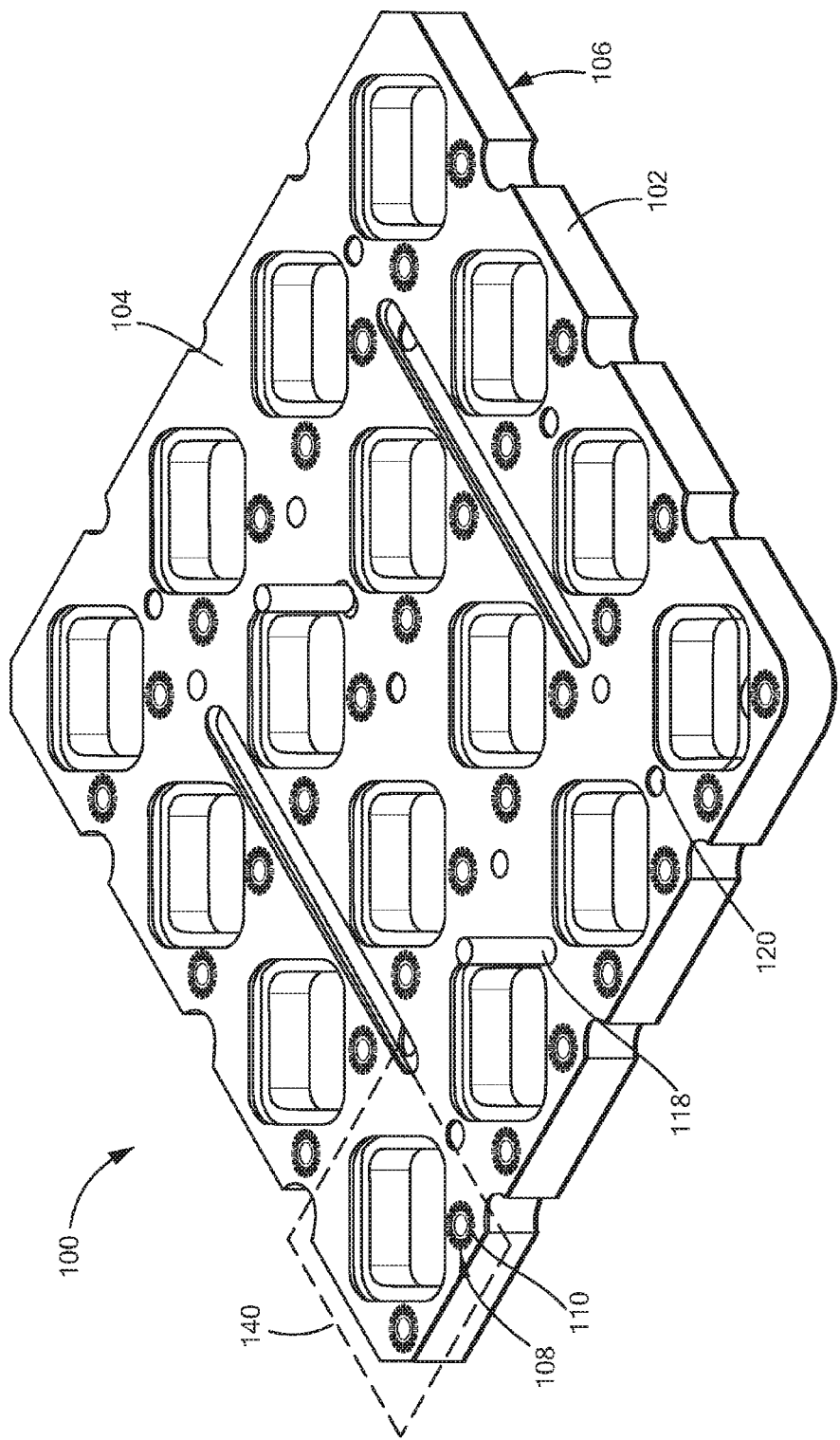
FIG. 1A is an isometric view of the RF interposer of FIG. 1.

FIG. 1A is another view the RF interposer 100 showing the conductive shims 104, 106 pressed (or otherwise bonded) to the carrier structure 102. As shown, conductive shims 104, 106 are sized and configured such that, when pressed against the carrier structure 102, each spring finger arrangement 110 located on the shims is positioned to surround a corresponding one of the RF ports 108. FIG. 1A also illustrates alignment pins 118 extending through openings 120 in a conductive shim (shim 104 in this example) to make contact with a PWB assembly mated thereto. Although two alignment pins 118 are shown in FIGS. 1 and 1A, any suitable number of alignment pins can be used.

In some embodiments, the RF interposer 100 provides interconnection between two PWB assemblies each having a plurality of components and a fixed number of RF ports associated with each component. For example, in phased array radar applications, each PWB component may be associated with two RF ports: a beamformer port and an antenna port. In some applications, each component may be associated with a transmit port and a receive port. Thus, as shown, the RF interposer 100 may include pairs of periodically spaced ports 108 and, in some embodiments, a component cavity 114 located adjacent thereto. This combination of elements is referred to herein as a "unit cell" and one illustrative unit cell is labeled 140 in FIG. 1A.

An RF interposer 100 may have periodically spaced unit cells. For example, the illustrative RF interposer 100 of FIGS. 1 and 1A can be said to include a 4×4 grid of unit cells, with two RF ports per unit cell. In other embodiments, an RF interposer 100 may have unit cells arranged in patterns other than a grid, such as a triangular lattice pattern.

Figure 2:
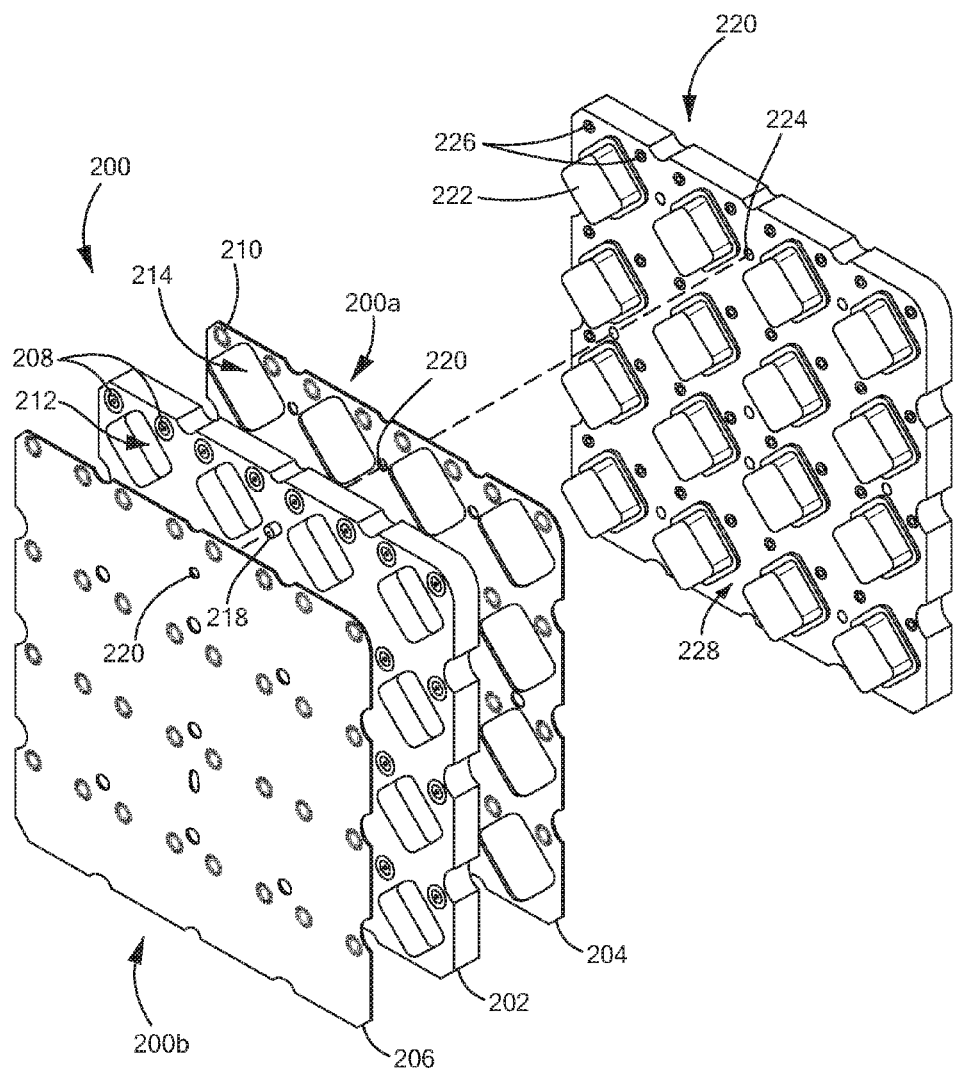
FIG. 2 is an exploded view of an illustrative RF interposer mated with a printed wiring board (PWB) assembly.

FIG. 2 shows another RF interposer 200 (which may be the same as or similar to interposer 100 of FIG. 1) and a PWB assembly 220 that can be mated thereto. The illustrative RF interposer 200 includes a carrier structure 202, a first conductive shim 204, and a second conductive shim 206. In this example, the carrier structure includes cavities 212 to receive corresponding components 222 located upon the PWB assembly 220 and the first conductive shim 204 (but not the second shim 206) includes corresponding component openings 214. This configuration may be suitable for mating a double-sided PWB assembly 220 to a first side 200a of the interposer and a single-sided PWB assembly (not shown) to a second side 200b of the interposer. In other embodiments, the RF interposer 200 can be configured to interconnect two double-sided PWB assemblies (e.g., by increasing the thickness of the carrier structure 202 and by providing component openings 214 in the second conductive shim 206).

As can be seen in FIG. 2, alignment structure 218 (here shown as alignment pins) pressed into the carrier structure 202 may extend through openings 220 of first shim 204 and into corresponding alignment holes 224 of the PWB assembly 220. The same (or different) alignment pins 218 may extend through openings 220 in the second shim 204 and into corresponding alignment holes of a second PWB assembly (not shown).

The PWB assembly 220 may be fixedly attached to the carrier structure 202. In some embodiments, the PWB assembly 220 may be screwed to the carrier structure 202.

Threaded screw holes may be tapped into the carrier structure 202 to facilitate mechanical assembly. Alternatively, screw inserts may be used. In a particular embodiment, at least six (6) screw holes (or inserts) are provided within the carrier structure 202.

The PWB assembly 220 includes a plurality of RF ports 226 and an RF ground plane 228. When the PWB assembly 220 is mated to the RF interposer 200, RF ports 208 embedded within the carrier structure 202 make electrical contact with corresponding RF ports 226 located upon the PWB assembly. In the case of coaxial transmission like RF ports 208, center conductors within each of the RF ports 208 may make electrical contact with corresponding RF pads 226 located upon the PWB assembly 220. To provide clearance for the coaxial center conductors, the conductive shim 204 may include openings 210 as shown. In addition, the PWB ground plane 228 makes electrical contact with the carrier structure 208 (which is provided from conductive material or non-conductive material with a conductive coating) via the conductive shim 204, thereby providing an ground return path. A second PWB assembly (not shown) can be likewise mated and electrically coupled to the second side 200b of the interposer, thereby providing RF interconnection of the two PWB assemblies.

To bridge air gaps between the PWB assembly 220 and RF interposer 200, the interposer RF ports 208 may utilize retractable/compressible pins as the center conductors. Further, the conductive shims 204, 206 may include one or more spring finger arrangements. In some embodiments, the spring finger arrangements are located around each of the pin openings 210, although this is not required. In some embodiments, the RF pads 226 located upon the PWB assembly 220 are larger than the center conductor pins, thereby increasing the tolerance to lateral misalignment between the PWB assembly 220 and the interposer 200.

Although the RF interposer concepts and structures sought to be protected herein are not limited to any specific types PWB assemblies, a particular type of PWB assembly is contemplated for use in phased array radar applications (e.g., radar applications that require large scan volume field-of-view and/or large tunable operating frequency). In particular, a PWB assembly 220 may be double-sided, wherein the components 222 on a first side correspond to active MMIC components attached in unit cell area and wherein components 222 on a second side of the PWB correspond to circulators and/or capacitors attached in unit cell area. It is appreciated that close proximity of the circulator can reduce RF losses between the active RF electronics and circulator and provides improved RF performance in active electronically scanned arrays by reducing voltage wave standing wave ratio induced load pull on a power amplifier. Moreover, close proximity of energy storage capacitance can provide charge to a power amplifier at lower series inductance, thereby reducing pulse "ringing" at leading/falling edges of an RF pulse.

Figure 3A:
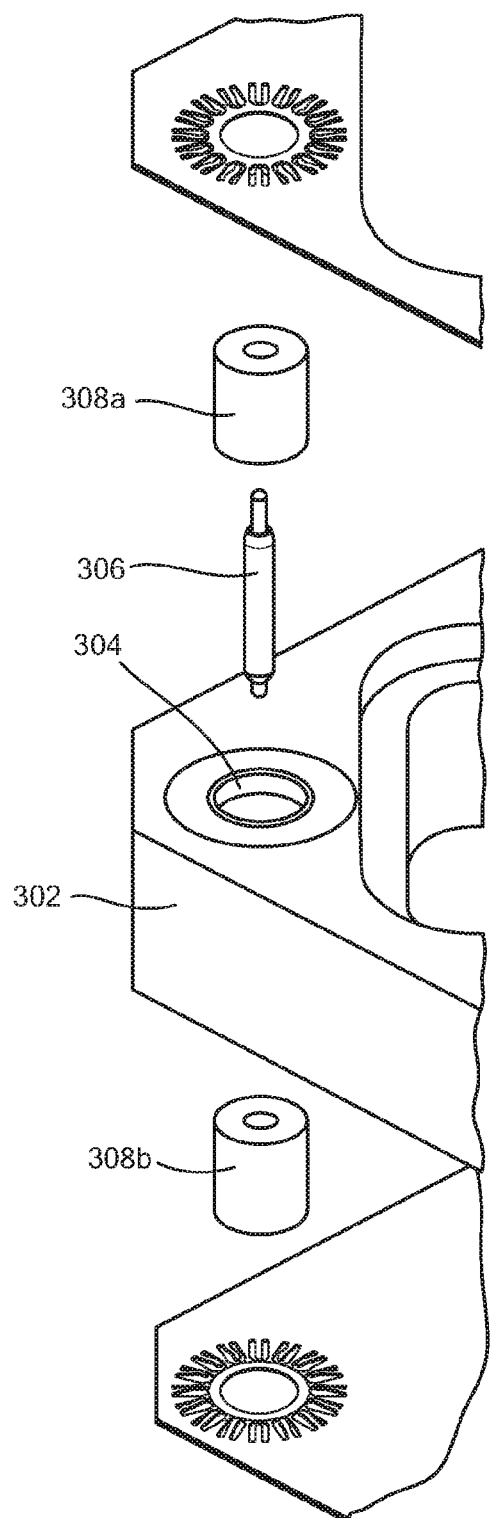
FIG. 3A is an exploded view of the RF port of FIG. 3.

FIGS. 3 and 3A shows an enlarged view of a single RF port 300 that may form a portion of an RF interposer (e.g., interposer 100 of FIG. 1). The illustrative RF port 300 is comprised of an outer conductor (sometimes referred to as an "outer shield") 304 extending from a first surface 302a of a carrier structure 300 to a second surface 302b of the carrier structure 300, a center conductor 306 positioned within the outer conductor 302, and a dielectric insulator 308 also positioned within the outer conductor 302 and surrounding the center conductor 306. It will be appreciated that the illustrative RF port 300 is an RF coaxial transmission line structure.

In various embodiments, the outer conductor 304 may be provided by the carrier structure 302 itself. For example, the outer conductor 304 may be formed by drilling a hole through the carrier structure 300. If the carrier structure is non-conductive (e.g., not metal), the hole may be plated with a conductive material.

The center conductor 306 may be provided as a metal pin with one or more retractable ends. The length of the pin 306 may be selected such that the retractable ends extend past the surfaces 302a, 302b of the carrier structure. In this configuration, the pin 306 can serve to bridge air gaps between the RF interposer and PWB assemblies mated thereto.

The dielectric insulator (or "sleeve") 308 can be provided from any suitable microwave dielectric material. In various embodiments, the center conductor pin 306 is press fitted into the dielectric insulator 308, which in turn may be press fitted into the outer conductor hole 304, locking the pin assembly into the carrier structure 302. In some embodiments (and as best seen in FIG. 3A), the dielectric insulator 308 may be provided as two separate sleeves 308a, 308b that can be fitted over opposite ends of the center conductor pin 306 and pressed together to surround the pin 306. Using two separate sleeves 308a, 308b may facilitate assembly of the RF port 300. In other embodiments, the dielectric insulator 308 may be provided as a single piece of dielectric material.

Although FIGS. 3 and 3A show the center conductor 306 and dielectric insulator 308 as being separate structures, it should be appreciated that they could be provided as a single structure. For example, a via could be drilled through the center of a dielectric insulator 308 and plated with a conductive material to form the center conductor 306. Conductive elastomer pins could then be attached to the ends of the plated via to complete the center conductor 306.

Figure 4A:
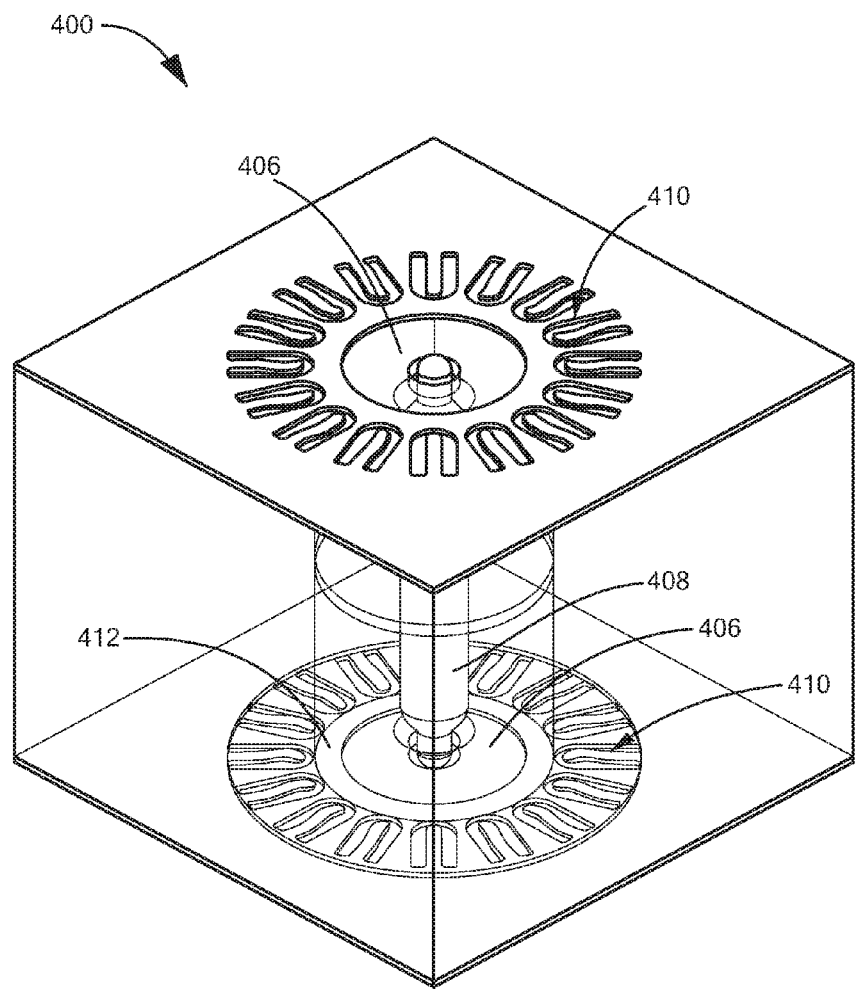
FIG. 4A is a transparent isometric view of the RF port of FIG. 4.

FIGS. 4 and 4A are transparent views of a single RF port 400 that may form a part of an RF interposer (e.g., RF interposer 100 of FIG. 1). As can be seen more clearly in these figures, the top and bottom conductive shims 402, 404 may include holes 406 through which the center conductor 408 can extend to make contact with RF ports located upon mated PWB assemblies (not shown). The shim holes 406 may be formed at the center of corresponding spring finger arrangements 410, although this is not required. In some embodiments, a support ring 412 is provided between a spring finger arrangement 410 and a shim hole 406 to provide extra rigidity and durability.

Figure 5A:
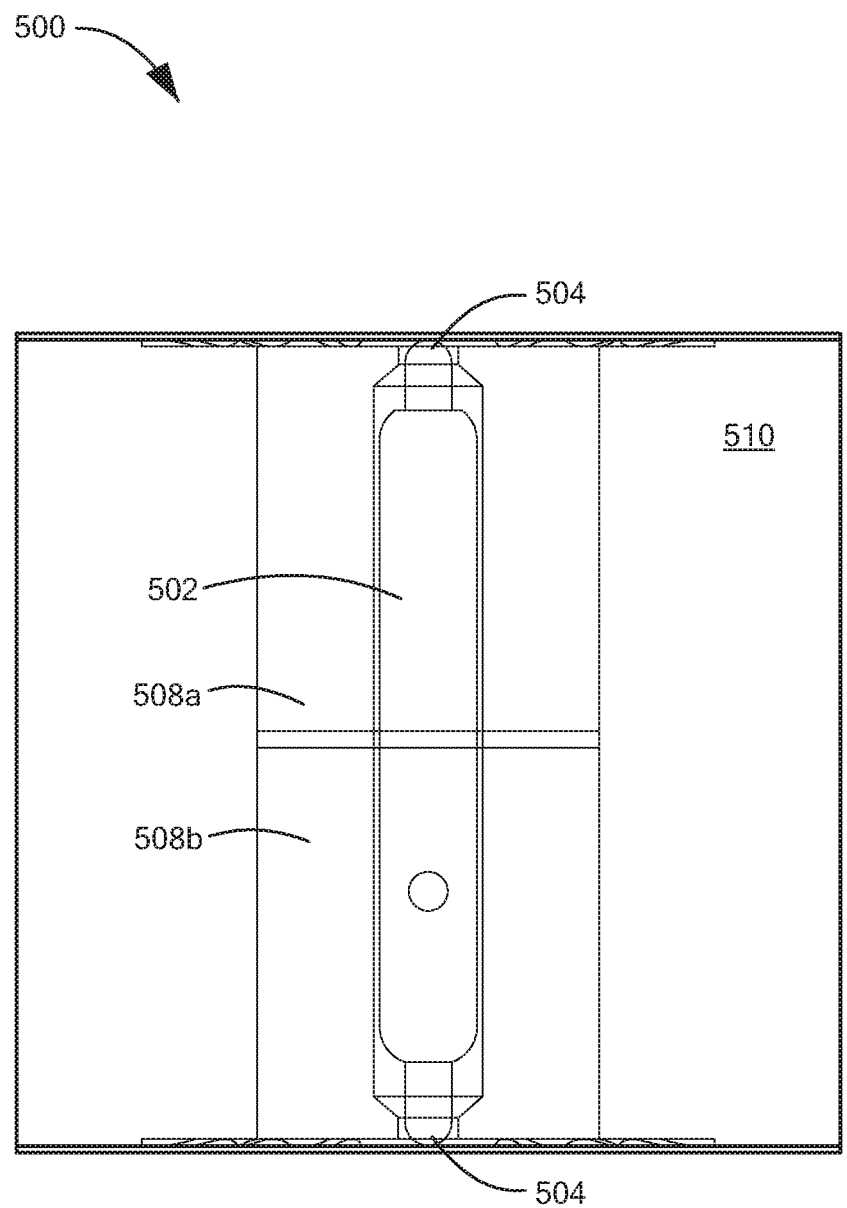

FIGS. 5 and 5A are cross-sectional views of a single RF port 500 that may form a part of an RF interposer. In this example, the center conductor 502 is provided as a pogo pin having one or more retractable ends 504 and an internal spring-loaded mechanism 506. Comparing the two figures, FIG. 5 shows the ends of the pin extended, whereas FIG. 5A shows them retracted. The cross sectional view also helps to illustrate that the dielectric insulator can be provided as two separate sleeves 508a, 508b. The dielectric sleeves 508a, 508b can be press fitted into a carrier structure 510 to lock the center conductor pin 502 in place.

Figure 6A:
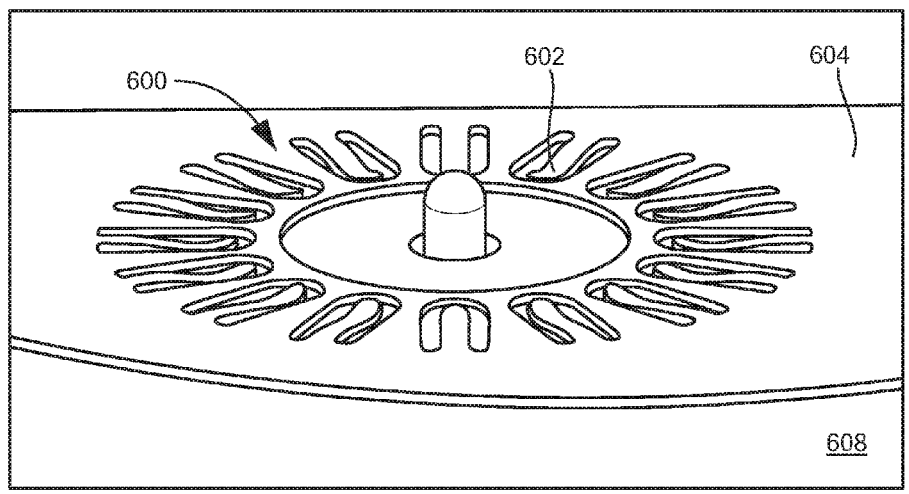
FIG. 6A is an isometric view of an illustrative spring finger arrangement pressed against an RF interposer carrier structure.

FIGS. 6 and 6A show an illustrative spring finger arrangement 600 that may form part of an RF interposer, such as the RF interposer 100 of FIG. 1. The spring finger arrangement 600 is comprised of a plurality of spring fingers 602. The spring fingers 602 may be formed as part of a conductive shim 604 using any suitable technique (e.g., a stamping process). In some embodiments, the spring fingers 602 are formed out of a conductive shim 604 having good "rebound" properties, such as beryllium copper.

FIG. 6 shows the spring fingers 602 in an uncompressed position, whereas FIG. 6A shows the spring fingers 602 in a compressed position. The spring fingers may be in the compressed position (FIG. 6A) when a PWB assembly is mated to the carrier structure 608. As such, the spring fingers 602 serve to bridge air gaps between a PWB assembly ground plane and the carrier structure 608—more specifically between the PWB ground plane and the conductive shim 604 and/or between the conductive shim 604 and the carrier structure 608.

In the uncompressed position (FIG. 6A), a spring fingers 602 extends away from the plane of the conductive shim 604 at a given angle/pitch 606 (denoted θ in the FIG. 6). The number of spring fingers 602 used and their pitch θ may be selected based on various factors, including manufacturing tolerances and intended operating frequency. In the example shown, a spring finger arrangement 600 includes sixteen (16) spring fingers 602, although other numbers of spring fingers (e.g., 8, 14, or 32) are contemplated. In some embodiments, multiple rows of spring fingers 602 can be added to further increase RF ground connectivity.

Figure 7A:
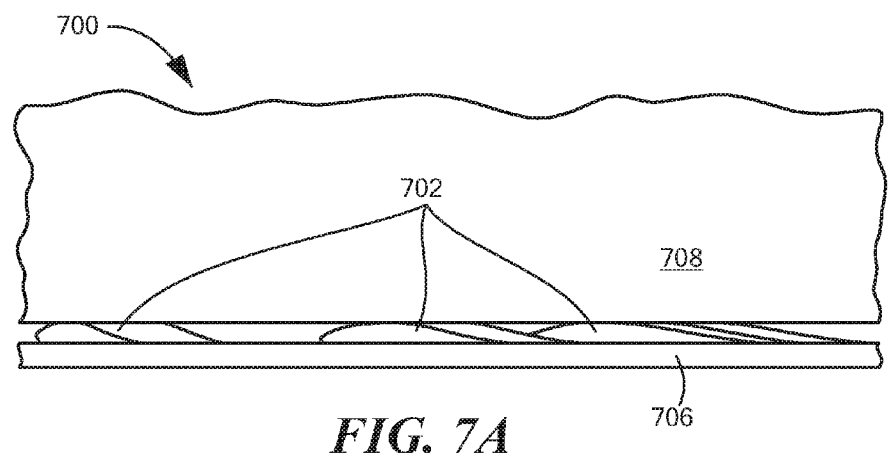

FIGS. 7 and 7A are side views showing an illustrative spring finger arrangement 700, which may be the same as or similar to the spring finger arrangement 600 of FIG. 6. As shown in FIG. 7, spring fingers 702 can serve to bridge an air gap 704 between a conductive shim 706 and a carrier structure 708. In some embodiments, spring fingers 702 can bridge air gaps less than or equal to 3 mils.

It should be appreciated that, although the spring fingers 702 are shown extending toward the carrier structure 708 (and thus away from a mated PWB assembly), the spring fingers 702 could alternatively extend toward the PWB assembly (i.e., the conductive shim 706 may be pressed directly against the interposer carrier structure 708). In yet another possibility, the spring finger assembly 700 may include spring fingers 702 extending in both directions, where some of the spring fingers 702, extend in a first direction to bridge air gaps between the conductive shim 706 and the carrier structure 708, and other spring fingers 702 extend in a second opposite direction to bridge air gaps between the conductive shim 706 and a mated PWB assembly.

All references cited herein are hereby incorporated herein by reference in their entirety.

Having described certain embodiments, which serve to illustrate various concepts, structures, and techniques sought to be protected herein, it will be apparent to those of ordinary skill in the art that other embodiments incorporating these concepts, structures, and techniques may be used. Elements of different embodiments described hereinabove may be combined to form other embodiments not specifically set forth above and, further, elements described in the context of a single embodiment may be provided separately or in any suitable sub-combination. Accordingly, it is submitted that scope of protection sought herein should not be limited to the described embodiments but rather should be limited only by the spirit and scope of the following claims.

What is claimed is:

1. A radio frequency (RF) interposer comprising:
  a carrier structure having a first planar surface and a second planar surface opposite the first planar surface;
  a plurality of RF ports supported by the carrier structure, each of the RF ports comprising a coaxial transmission line structure having a center conductor extending from carrier structure first planar surface to the carrier structure second planar surface and an outer conductor electrically separated from the center conductor by a dielectric insulator;
  a first conductive shim having a plurality of spring fingers; and
  a second conductive shim having a plurality of spring fingers,
  wherein, when the first conductive shim is disposed over the carrier structure first planar surface and the second conductive shim is disposed over the carrier structure second planar surface, an electrical pathway is established between the first shim, outer conductors of ones of the plurality of RF ports, and the second shim;
  wherein the spring fingers of said first conductive shim and the spring fingers of said second conductive shim project toward the surface of said carrier structure.

2. The RF interposer of claim 1 wherein the first and second conductive shims include a plurality of openings sized and positioned to expose center conductors of the RF ports when the first conductive shim is disposed over the carrier structure first planar surface and the second conductive shim is disposed over the carrier structure second planar surface.

3. The RF interposer of claim 2 wherein respective ones of said spring fingers of the first conductive shim are arranged around respective ones of the openings such that said spring fingers are in electrical contact with respective ones of the outer conductors of the RF ports.

4. The RF interposer of claim 1 wherein:
  the carrier structure includes a plurality of cavities positioned and sized to provide clearance for components of a printed wiring board (PWB) mated to the RF interposer; and
  each of the plurality of spring fingers of said first and second conductive shims are in electrical contact with an outer conductor of a corresponding one of said plurality of RF ports.

5. The RF interposer of claim 1 wherein ones of the plurality of RF port center conductors are provided as retractable pins.

6. The RF interposer of claim 1 wherein the carrier structure is provided as a conductive material or a non-conductive material having a conductive coating.

7. The RF interposer of claim 6 wherein the carrier structure comprises aluminum.

8. The RF interposer of claim 1 wherein the first and second conductive shims comprise copper sheets.

9. The RF interposer of claim 1 comprising a plurality of periodically arranged unit cells, wherein each of the unit cells includes a fixed number of the RF ports.

10. The RF interposer of claim 9 wherein the unit cells are arranged in a grid.

11. The RF interposer of claim 9 wherein the unit cells are arranged in a triangular lattice.

12. The RF interposer of claim 9 wherein each of the unit cells includes two of the RF ports.

13. The RF interposer of claim 9 wherein the carrier structure includes a plurality of cavities positioned and sized to provide clearance for components of a printed wiring board (PWB) mated to the RF interposer, wherein each of the unit cells includes one of the plurality of cavities.

14. The RF interposer of claim 1 further comprising a plurality of alignment pins extending perpendicular to the first planar surface.

15. The RF interposer of claim 1 wherein the spring fingers of said first and second conductive shims are in electrical contact with the outer conductors of ones of the plurality of RF ports such that the electrical pathway established between the first shim, outer conductors of ones of the plurality of RF ports and the second shim correspond to a ground signal path.

16. The RF interposer of claim 1 wherein:
the spring fingers of said first conductive shim and the spring fingers of said second conductive shim project toward the surface of said carrier structure; and
the spring fingers of said first and second conductive shims are in electrical contact with the outer conductors of ones of the plurality of RF ports such that the electrical pathway established between the first shim, the outer conductors of ones of the plurality of RF ports and the second shim correspond to a ground signal path.

* * * * *